United States Patent [19]
Moriya

[11] Patent Number: 5,900,292
[45] Date of Patent: * May 4, 1999

[54] LIQUID CRYSTAL POLYMER FILM AND A METHOD FOR MANUFACTURING THE SAME

[75] Inventor: Akira Moriya, Okayama, Japan

[73] Assignee: Japan Gore-Tex, Inc., Tokyo, Japan

[ * ] Notice: This patent is subject to a terminal disclaimer.

[21] Appl. No.: 08/891,384

[22] Filed: Jul. 11, 1997

Related U.S. Application Data

[63] Continuation of application No. 08/392,433, Feb. 22, 1995, Pat. No. 5,681,624.

[30] Foreign Application Priority Data

Feb. 25, 1993 [JP] Japan ................................... 5-061045
Feb. 23, 1994 [JP] Japan ................................... 6-047963

[51] Int. Cl.$^6$ .............................. B32B 5/18; B32B 27/04; B32B 27/08; B29C 55/10
[52] U.S. Cl. ........................ 428/1; 428/306.6; 428/308.4; 428/319.3; 428/421; 428/422; 428/910; 264/288.8; 264/290.2; 264/348; 156/229; 427/374.1; 427/393.5
[58] Field of Search ............................ 428/1, 216, 306.6, 428/308.4, 319.3, 336, 421, 422, 910; 264/288.8, 290.2, 348; 156/229; 427/374.1, 393.5

[56] References Cited

U.S. PATENT DOCUMENTS

| | | | |
|---|---|---|---|
| 3,953,566 | 4/1976 | Gore | 264/288 |
| 3,962,153 | 6/1976 | Gore | 260/2.5 R |
| 4,096,227 | 6/1978 | Gore | 264/210 R |
| 4,187,390 | 2/1980 | Gore | 174/102 R |
| 4,387,133 | 6/1983 | Rinjiro et al. | 428/215 |
| 4,966,806 | 10/1990 | Lusignea et al. | 428/220 |
| 4,966,807 | 10/1990 | Harvey et al. | 426/220 |
| 4,975,312 | 12/1990 | Lusignea et al. | 428/209 |
| 5,039,208 | 8/1991 | Ohnishi et al. | 359/100 |
| 5,238,523 | 8/1993 | Yuasa et al. | 150/517 |
| 5,681,624 | 10/1997 | Moriya | 428/1 |

FOREIGN PATENT DOCUMENTS

| | | |
|---|---|---|
| 0 232 422 | 8/1987 | European Pat. Off. . |
| 0 484 163 | 5/1992 | European Pat. Off. . |
| 0 512 397 | 11/1992 | European Pat. Off. . |
| 0 612 610 | 8/1994 | European Pat. Off. . |
| 60-172306 | 9/1985 | Japan . |
| 61 116 331 | 6/1986 | Japan . |
| 2 166 685 | 5/1986 | United Kingdom . |
| 89 12548 | 12/1989 | WIPO . |

*Primary Examiner*—Vivian Chen
*Attorney, Agent, or Firm*—Gary A. Samuels

[57] ABSTRACT

A composite material is formed by combining a liquid crystal polymer with a porous or nonporous support membrane to provide either a thin, multiaxially oriented liquid crystal film on the support membrane formed by laminating the liquid crystal polymer onto a porous or nonporous support membrane, followed by multiaxial orientation; or to provide a thin, multiaxially oriented liquid crystal polymer region within a porous support membrane formed by impregnating the liquid crystal polymer into a porous support membrane, followed by multiaxial orientation. Lyotropic or thermotropic liquid crystal polymers may be used.

13 Claims, No Drawings

LIQUID CRYSTAL POLYMER FILM AND A METHOD FOR MANUFACTURING THE SAME

CROSS-REFERENCE TO RELATED APPLICATION

This application is a continuation of application Ser. No. 08/392,433 filed Feb. 22, 1995, U.S. Pat. No. 5,681,624.

FIELD OF THE INVENTION

The invention relates to liquid crystal polymer films and, more specifically, to thin oriented liquid crystal polymer films and to a method for producing them.

BACKGROUND OF THE INVENTION

Liquid crystal polymers are a family of materials that exhibit a highly ordered structure in the melt, solution, and solid states. They can be broadly classified into two types; lyotropic, having liquid crystal properties in the solution state, and thermotropic, having liquid crystal properities in the melted state.

Most liquid crystal polymers exhibit excellent physical properties such as high strength, good heat resistance, low coefficient of thermal expansion, good electrical insulation characteristics, low moisture absorption, and are good barriers to gas flow. Such properties make them useful in a broad range of applications in the form of fibers, injection molded articles, and, in sheet form, as electronic materials for printed circuit boards, packaging, and the like.

However, many of the physical properties of liquid crystal polymers are very sensitive to the direction of orientation of the liquid crystal regions in the polymer. The ordered structure of the liquid crystal polymer is easily oriented by shear forces occurring during processing and highly aligned liquid crystal chains can be developed that are retained in the solid state, and result in highly anisotropic properties. This can be highly desirable for certain products, for example, in filaments, fibers, yarns, and the like. Anisotropic properties are often not desirable, however, in products having planar forms, such as tape, films, sheet, and the like.

A number of methods are used to produce liquid crystal polymer materials in planar forms that have more balanced, less anisotropic properties. These include the use of multilayer flat dies which are oriented such that they extrude overlapping layers at intersecting angles, use of static mixer-agitators at the die inlets, and the like. More recently, dies having rotating or counter-rotating surfaces have become known in the art and successfully used. These extrusion techniques, used separately or in combination with other methods known in the art, such as film blowing, can produce liquid crystal polymer film and sheet that are multiaxially oriented, that is, oriented in more than one direction, and have more balanced physical properties.

A characteristic of these methods is that locally, for example, at the surfaces of the sheet or film, the molecules are oriented in the planar x-y directions by shear imparted at the extrusion surfaces. In the z-direction, i.e., throughout the thickness, the x-y orientation of the molecules will change progressively from the orientation at one surface to the orientation at the other surface of the planar form. A drawback to these methods is that when attempting to make very thin multiaxially oriented films, e.g., films having a thickness of 25 micrometers or less, the forces imparted in the orientation transition region of the liquid crystal polymer by the extrusion surfaces are exerted in increasingly opposing directions as the distance between the extrusion surfaces diminishes and the formation of pinholes, tears, and other imperfections, for example, separation of surface layers of the film takes place.

SUMMARY OF THE INVENTION

This invention provides a composite material comprising a multiaxially oriented liquid crystal polymer film having a thickness of 25 micrometers or less.

Broadly speaking, the invention comprises the combination of a porous or nonporous membrane of a synthetic polymer with a liquid crystal polymer to form a nonporous composite material in which, during the processing steps, the support membrane provides support to the liquid crystal polymer and is the medium by which the liquid crystal polymer is uniformly oriented throughout the film thickness and, at the same time, formed into a thin film on the surface of the support membrane, or formed into a thin layer within the porous structure of the support membrane.

It is recognized that "membrane" and "film" can often be used interchangeably, however, to avoid confusion, "membrane" will generally be used herein with respect to the porous support material; and "film" with respect to liquid crystal polymer material.

Liquid crystal polymer, as used herein, is meant to include polymer alloys having a liquid crystal polymer component as well as liquid crystal polymers alone. For convenience, the term "liquid crystal polymer" is used herein to include material of both kinds.

By multiaxially-oriented liquid crystal polymer, as used herein, is meant liquid crystal polymer material to which forces in more than one direction have been applied in order to orient the liquid crystal polymer.

By porous as used herein is meant a structure of interconnected pores or voids such that continuous passages and pathways throughout a material are provided.

An embodiment of the invention is a multiaxially-oriented nonporous composite material comprising at least one stretched porous polytetrafluoroethylene membrane and at least one stretched oriented film of liquid crystal polymer. The liquid crystal polymer film is adhered to the porous polytetrafluoroethylene membrane in laminar relationship, after which they are co-stretched in at least two directions to orient the liquid crystal polymer and produce a multiaxially-oriented liquid crystal polymer film having a substantially uniform thickness of 25 micrometers or less.

Another embodiment of the invention is a nonporous multiaxially-oriented composite material comprising a stretched porous polytetrafluoroethylene membrane having within its pores a layer of stretched oriented liquid crystal polymer. The liquid crystal polymer is impregnated into, and substantially fills the pores of the porous polytetrafluoroethylene membrane to a depth of at least 50 percent of the thickness of the polytetrafluoroethylene membrane. The liquid crystal polymer-filled porous polytetrafluoroethylene membrane is then stretched in at least two directions to orient the liquid crystal polymer and produce a multiaxially oriented liquid crystal polymer layer having a substantially uniform thickness of 25 micrometers or less within the porous polytetrafluoroethylene membrane.

Another embodiment of the invention is a multiaxially-oriented composite material comprising at least one stretched nonporous support membrane of polyethersulfone and at least one stretched oriented film of liquid crystal polymer. The liquid crystal polymer film is adhered to the polyethersulfone membrane in laminar relationship, after which they are co-stretched in at least two directions to orient the liquid crystal polymer and produce a liquid crystal polymer film having a substantially uniform thickness of 25 micrometers or less.

Yet another embodiment of the invention is a process for producing a nonporous multiaxially-oriented liquid crystal polymer film comprising the steps of:

(a) adhering a liquid crystal polymer film to at least one support membrane of synthetic polymer;

(b) heating the composite material obtained in step (a) while under tension to a temperature above the melt point of the liquid crystal polymer;

(c) stretching the heated composite material of step (b) in at least two directions while maintaining the temperature at or above the melt point of the liquid crystal polymer to multiaxially orient the liquid crystal polymer; and (d) cooling the product of step (c).

A further embodiment of the invention is a process for producing a nonporous multiaxially-oriented liquid crystal polymer layer within the interconnected pores of a porous polytetrafluoroethylene membrane comprising the steps of:

(a) impregnating liquid crystal polymer into a porous polytetrafluoroethylene membrane, and filling the pores of the polytetrafluoroethylene membrane to a depth of at least 50 percent of the thickness of the polytetrafluoroethylene membrane to form a nonporous layer of liquid crystal polymer within the porous membrane;

(b) stretching the composite material obtained in step (a) in at least two directions to multiaxially-orient the liquid crystal polymer while maintaining the liquid crystal polymer in a liquid state; and (c) solidifying the liquid crystal polymer.

DETAILED DESCRIPTION OF THE INVENTION

Longitudinal direction, x-direction, and machine direction (MD) as used herein indicate the planar direction of manufacture of a film or sheet; transverse direction (TD) and y-direction indicate the planar direction normal to the direction of manufacture.

Materials for the support membrane of the invention are selected on the basis of their ability to withstand the forces and temperatures of processing, on their ability to be stretched, and on their chemical resistance to the liquid crystal polymers and solutions with which they are combined. The support membrane is preferably made of a synthetic polymer and may be porous or nonporous. Suitable synthetic polymers for nonporous support membranes include thermoplastic polyimides, polyethersulfones, and polyethylene terephthalates.

Porous support membranes should have an average pore size in the range 0.05 to 5.0 micrometers, preferably 0.2 to 1.0 micrometers; a pore volume in the range 40 to 95 percent, preferably 60 to 85 percent; and a thickness in the range 5 to 300 micrometers, preferably 20 to 150 micrometers.

Porous sheets or membranes of synthetic polymers, for example, polyethylene, polypropylene, polyesters, or fluoropolymers, and the like, can be used. Fluoropolymers, including tetrafluoroethylene/(perfluoroalkyl) vinyl ether copolymer (PFA), tetrafluoroethylene/hexafluoropropylene copolymer (FEP), and polytetrafluoroethylene (PTFE), and the like, are preferred for their processing characteristics, temperature resistance, and chemical inertness. Most preferred are porous membranes of polytetrafluoroethylene.

Suitable porous polytetrafluoroethylene membranes can be made by processes known in the art, for example, by papermaking processes, or by processes in which filler materials are incorporated with the PTFE resin and are subsequently removed to leave a porous structure. Preferably the porous polytetrafluoroethylene membrane is porous expanded polytetrafluoroethylene membrane having a structure of interconnected nodes and fibrils, as described in U.S. Pat. Nos. 3,953,566, 3,962,153, 4,096,227, and 4,187,390 which fully describe the preferred material and processes for making them.

Both thermotropic and lyotropic liquid crystal polymers can be used as the liquid crystal polymer of the invention. Examples of suitable thermotropic liquid crystal polymers include aromatic polyesters which exhibit liquid crystal properties when melted and which are synthesized from aromatic diols, aromatic carboxylic acids, hydroxycarboxylic acids, and other like monomers. Typical examples include a first type consisting of parahydroxybenzoic acid (PHB), terephthalic acid, and biphenol; a second type consisting of PHB and 2,6-hydroxynaphthoic acid; and a third type consisting of PHB, terephthalic acid, and ethylene glycol. They are represented below as Formulas 1, 2, and 3 respectively.

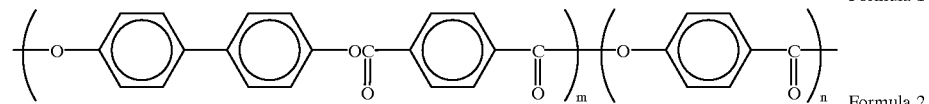

Formula 1

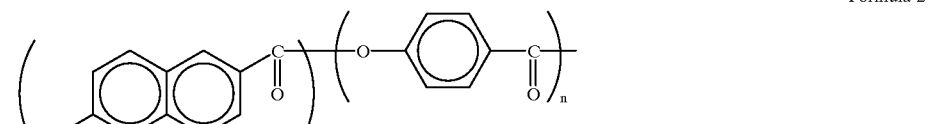

Formula 2

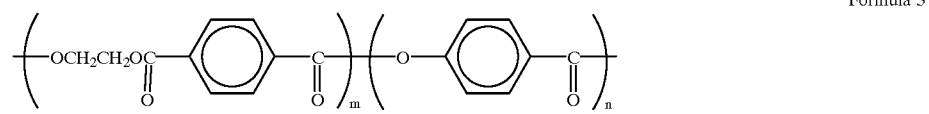

Formula 3

Examples of suitable lyotropic liquid crystal polymers include concentrated sulfuric acid solutions of poly(p-phenylene terephthalamide) (PPTA), silk fibroin aqueous solutions, and sericin aqueous solutions. A PPTA liquid crystal polymer is represented by Formula 4 below.

Formula 4

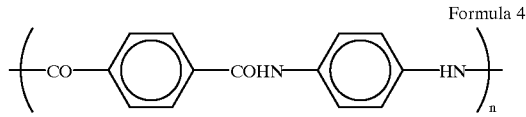

Also, in the present invention, a polymer alloy having a liquid crystal polymer component can be used. In such cases the polymer which is mixed with or chemically bonded to a liquid crystal polymer can be selected from the group consisting of, but not limited to, polyetheretherketones, polyether sulfones, polyimides, polyether imides, polyamides, polyamidoimides, polyallylates, polyacrylates, and the like. The polymers and liquid crystal polymer components are mixed in a weight ratio of 10:90 to 90:10, preferably in the range of 30:70 to 70:30.

The liquid crystal polymers and polymer alloys described hereinabove are meant for illustration and not for limitation of the invention. It is recognized by the inventor that many other liquid crystal polymers and polymer alloys suitable for use in the invention are known in the art. Likewise, it is recognized that compatibilizers, plasticizers, flame retardant agents, and other additives may be contained in the liquid crystal polymers of the invention.

In one embodiment of the invention a composite material is formed by applying a melt-processible thermotropic liquid crystal polymer film to the surface of a support membrane, for example, a liquid crystal polymer film separately produced by one of the methods described earlier. The liquid crystal polymer may also be applied by direct extrusion on to the surface of the support membrane by methods well known in the art. The applied liquid crystal polymer film should have a thickness in the range 50 to 1000 micrometers, preferably in the range 100 to 500 micrometers.

The thermotropic liquid crystal polymer film is adhered to the support membrane using conventional lamination methods, for example, by application of heat and pressure by heated platens, or by passage through the nip of heated calender rolls. Typically, the temperature of the platens or rolls are in the range 10 to 50° C. higher than the melt point of the thermotropic liquid crystal polymer. Good bonding of the liquid crystal polymer film to the support membrane is necessary in order to ensure that in the subsequent stretching step the liquid crystal polymer will move with and be oriented by the support membrane as it is stretched. In the lamination step to a porous support membrane an amount of liquid crystal polymer, sufficient to securely bond it to the support membrane, is forced into the pores of the surface region of the porous support membrane. Typically, about 10 percent of the material of the liquid crystal polymer film is forced into the pores of the surface region, however, more or less liquid crystal polymer may be forced into the pores depending on the properties of the support membrane, the melt characteristics of the liquid crystal polymer, and other process considerations. If desired, a second support membrane may be laminated in like manner to the other side of the liquid crystal polymer film, thus forming a sandwich structure comprising a liquid crystal polymer film between two layers of support membrane. Alternatively, multiple alternating layers of liquid crystal polymer film and support membranes may be laminated together to form the composite material.

The composite material formed of the thermotropic liquid crystal polymer film and support membrane is then heated to a temperature at or above the melt point of the liquid crystal polymer and stretched in at least two directions. Stretching in at least two directions may be done simultaneously or sequentially, and may be done in one or more steps. The amount of stretch, relative to original dimensions in the planar x-y directions or radial directions, is ordinarily in the range 1.5 to 15:1, preferably in the range 4 to 8:1. The rate of stretch is generally in the range 5% to 500% per minute, preferably in the range 20% to 100% per minute; at a speed generally in the range 0.2 to 10 meters/minute, preferably in the range 1 to 6 meters/minute.

Stretching may be done using conventional equipment or apparatus known in the art. For example, multiaxial simultaneous stretching can be done using a radial stretching pantograph; and biaxial stretching in the planar x-y directions can be done, simultaneously or sequentially, using an x-y direction stretching pantograph. Also, uniaxial stretching equipment can be used sequentially, for example, differential speed rolls for stretching in the machine direction (MD) and tenter frames for stretching in the transverse direction (TD).

As the porous support membrane is stretched in the planar x-y directions the area of its surface progressively increases and its thickness is progressively reduced. The melted liquid crystal polymer film, bonded to and supported by the porous support membrane, is also stretched by the stretching membrane, also increases in area in the planar x-y directions, and the liquid crystal regions of the film become uniformly oriented from one planar surface to the other as well as in the x-y directions by the stretching. The liquid crystal polymer film thus produced has virtually no orientation gradient or orientation layering effects in the z-direction, i.e., through its thickness At the same time, as there is no change in the volume of liquid crystal polymer, the liquid crystal polymer film becomes progressively thinner as the material of the film is dragged and spread by the stretching membrane.

By controlling the amount of stretch, rate of stretch and directions of stretch of the composite material, the liquid crystals can be aligned in a preferred orientation, or aligned multiaxially and more randomly to provide relatively balanced physical properties. In general, liquid crystal polymer films having balanced physical properties are very useful, in particular, for electronic applications such as printed circuit boards, and are preferred. By controlling the amount of liquid crystal polymer initially adhered to the porous support membrane, i.e., by using thicker or thinner starting films, and adjusting the amount of stretch to provide the desired increase in planar surface area, the thickness of the liquid crystal polymer film is reduced to 25 micrometers or less, and can be as thin as 2 micrometers. Furthermore, the liquid crystal polymer film or layer remains intact, does not have holes or tears, has a very uniform thickness, is uniformly oriented from one planar surface to the other, and has a remarkably smooth surface.

After the stretching step the composite material should be heat treated to stabilize the physical properties and reduce strains in the liquid crystal polymer. The heat treatment is done with the material restrained to prevent shrinking. Heat treatment temperature will vary according to the thermotropic liquid crystal polymer used, but is generally in the range from slightly above the crystallizing point to slightly below the melt range of the liquid crystal polymer.

In a related embodiment of the invention, instead of bonding a film of thermotropic liquid crystal polymer to the surface of the porous support membrane by partially impregnating the liquid crystal polymer into the pores of the surface region as described hereinabove, the thermotropic liquid crystal polymer is fully impregnated into the porous support-membrane, so that little of the liquid crystal polymer remains on the surface of the porous support membrane, and a composite material comprising a nonporous layer of liquid crystal polymer within the pore structure of the porous support membrane is formed. The thermotropic liquid crystal polymer is impregnated into and substantially fills the pores of the porous support membrane to a depth of 50 percent or more, preferably 80 percent or more, of the thickness of the porous support membrane. The composite material is processed as described hereinabove and a nonporous multiaxially-oriented liquid crystal polymer layer having a substantially uniform thickness of 25 micrometers or less within the porous support membrane is produced.

Lyotropic liquid crystal polymers are inherently more difficult to process due to the aggressive solvents of their solutions, but may also be used in the composite material of the invention. Their nature requires that they be processed, at least in part, while still in solution or in a semi-liquid state. Also, because the solvents are generally concentrated acids or aqueous solutions of acids, and the porous support membranes, in particular the preferred porous fluoropolymer membranes, can be inherently hydrophobic, it may be necessary to pretreat the porous support membranes to make them hydrophilic.

To make hydrophobic porous support membranes wettable by the aqueous solutions they can be treated with fluorine-containing surfactants known in the art, or with a hydrophilizing treatment such as is disclosed in U.S. Pat. No. 5,130,024 to Fujimoto et al, in which the hydrophilizing agent is a hydrophilic copolymer made by copolymerizing a fluorine-containing ethylenically unsaturated monomer and a non-fluorinated vinyl monomer containing a hydrophilic group.

Solutions containing the lyotropic liquid crystal polymer can be applied to the surface of the porous support membrane, or impregnated into the porous support membrane, by conventional means such as solvent casting from a die, dip coating, roll coating, and the like, to form a composite material. To obtain a desired lyotropic liquid crystal polymer film thickness or depth of impregnation it may be necessary to repeat the application step several times. Also, depending on the lyotropic liquid crystal polymer used, it may be necessary to perform intermediate coagulation or congealing steps peculiar to the polymer.

When forming a film of lyotropic liquid crystal polymer on the surface of the porous support membrane the film thickness should be in the range 20 to 500 micrometers, preferably 30 to 200 micrometers. Again, as described above, penetration of the liquid crystal polymer into the surface regions of the porous support membrane is necessary to ensure that in the subsequent stretching step the liquid crystal polymer will move with and be oriented by the support membrane as it is stretched. When forming a layer of lyotropic liquid crystal polymer within the pore structure of the porous support membrane the depth of impregnation of the liquid crystal polymer should be as described hereinabove for thermotropic liquid crystal polymers.

The composite material containing the lyotropic liquid crystal polymer is then stretched in at least two directions, which can be done using the equipment described hereinabove. As noted earlier, the lyotropic liquid crystal polymer must be maintained in sufficiently liquid or semi-liquid form so that the liquid crystal regions can be oriented and the liquid crystal polymer can move with the porous support membrane as they are stretched. The amount of stretch relative to the original dimensions for the composite material containing the lyotropic liquid crystal polymer should be in the range 1.1 to 10:1, preferably in the range 1.2 to 5:1. The rate of stretch should be generally in the range 3% to 300% per minute, preferably 5% to 50% per minute; at a speed generally in the range 0.05 to 5 meters/minute, preferably in the range 1 to 3 meters/minute.

After stretching the composite material may be rinsed to remove residual solvent, dried, and the liquid crystal polymer permitted to solidify. By following the procedures listed above composite material having multiaxially oriented lyotropic liquid crystal polymer films or layers having thicknesses of 25 micrometers or less are produced. Furthermore, the liquid crystal polymer film or layer remains intact, does not have holes or tears, has a very uniform thickness, is uniformly oriented from one planar surface to the other, and has a remarkably smooth surface.

The nonporous composite materials of the invention comprising multiaxially oriented liquid crystal polymer films or layers, produced as described above and which are oriented so as to provide relatively balanced physical properties, are thin and light in weight and, furthermore, have strength, flexibility, thermal expansion, and liquid and gas barrier characteristics that make them highly desirable for use as printed circuit board and other electronic substrates, and the like.

TEST DESCRIPTIONS

Tensile Test

Tensile strength and tensile elongation were measured in accordance with Japanese Industrial Standard JIS K 7127.

Measurement values are given in $kg/mm^2$, and are shown in Table 1.

Surface Roughness

Surface roughness was measured by a profilometer, Model SURFCOM 570A or Model SURFCOM 1500A, made by Tokyo Seimitsu Co.

Roughness units, Ra, are given in micrometers and, in accordance with Japanese Industry Standard JIS B0601, represent the arithmetic mean of the absolute value of the deviation from the center line.

Surface Layer Separation

The sample surface is softly rubbed with sandpaper and examined visually to determine if fibers have been created or raised from the surface. The results are reported simply as "yes" (fibers present) or "no" (no fibers present).

EXAMPLE 1

A thermotropic liquid crystal polymer (VECTRA® A-950 resin, supplied by Polyplastics Co.) was extruded and blown at a ratio of 1.2:1 to provide a film 110 micrometers thick. A 50 mm diameter uniaxial screw extruder with a rotating die (Type 304 SS) having a 100 mm orifice was used. Extrusion conditions were: die rotation rate—7 RPM; die temperature—300° C.; takeup rate—2 m/min.

A porous expanded polytetrafluoroethylene membrane having a nominal pore size of 0.5 micrometer, pore volume of 80%, and a thickness of 50 micrometers was adhered to each side of the thermotropic liquid crystal polymer film. The materials were laminated by application of heat and pressure by passage through the nip between metal rolls heated to 330° C. at an applied pressure of about 30 kg/cm.

The laminate thus formed was mounted in a biaxial (x-y direction) stretching pantograph, heated to a temperature in its melt range, and stretched in two directions. The composite material was stretched an amount of 4:1 in each direction, at a stretch rate of 3 m/min., and at a temperature of 295° C. Stretching in each direction was done sequentially. The composite stretched material was then heat treated at a temperature of 240° C. for 3 minutes while restrained from shrinking, A nonporous composite material of the invention having a thickness of 10 micrometers was produced.

The material was examined and found to not have tears or holes. Samples were prepared for tensile tests, surface roughness measurements, and surface layer separation tests. The test results are shown in Table 1.

EXAMPLE 2

A porous expanded polytetrafluoroethylene having a nominal pore size of 0.5 micrometers, a pore volume of 80%, and a thickness of 40 micrometers, was pretreated with a fluorine-containing surfactant to make it wettable. The treated porous membrane was placed on a casting belt in preparation for solvent casting a lyotropic liquid crystal polymer on its surface.

A concentrated sulfuric acid solution containing 15% poly(p-phenylene terephthalamide) (PPTA) was cast on the surface of the porous expanded polytetrafluoroethylene membrane and allowed to impregnate into the membrane. Casting equipment having a static mixer-stirrer at its die inlet was used. While still on the casting belt, the impregnated expanded polytetrafluoroethylene membrane was immersed in an aqueous solution of sulfuric acid (25%) to coagulate the PPTA. The impregnated membrane was then removed from the belt and rinsed in water. These steps were repeated four times until the pores of the porous expanded polytetrafluoroethylene membrane, to depth of about 55% of the thickness of the membrane, were filled with PPTA.

The composite material thus formed was then stretched sequentially in two directions. The composite material was stretched an amount of 2:1 in each direction, at a stretch rate of 1 m/min; first in the machine direction by differential speed rolls, and then in the transverse direction using a tenter frame. After stretching, the composite material was oven dried at a temperature of 200° C. for 10 minutes.

A nonporous composite material of the invention having a thickness of 10 micrometers was produced.

The material was examined and found to not have tears or holes. Samples were prepared for tensile tests, surface roughness measurements, and surface layer separation tests. The test results are shown in Table 1.

EXAMPLE 3

A thermotropic liquid crystal polymer (VECTRA® A-950 resin, supplied by Polyplastics Co.) was extruded and blown at a ratio of 1.2:1 to provide a film 110 micrometers thick. A 50 mm diameter uniaxial screw extruder with a rotating die (Type 304 SS) having a 100 mm orifice was used. Extrusion conditions were: die rotation rate—7 RPM; die temperature—300° C.; takeup rate—2 m/min.

A nonporous polyethersulfone membrane having a thickness of 50 micrometers was adhered to each side of the thermotropic liquid crystal polymer film. The materials were laminated by application of heat and pressure by passage through the nip between metal rolls heated to 330° C. at an applied pressure of about 3 kg/cm.

The laminate thus formed was mounted in a biaxial (x-y direction) stretching pantograph, heated to a temperature in its melt range, and stretched in two directions. The composite material was stretched an amount of 4:1 in each direction, at a stretch rate of 100%/min., and at a temperature of 295° C. Stretching in each direction was done sequentially. The composite stretched material was then heat treated at a temperature of 240° C. for 3 minutes while restrained from shrinking, A nonporous composite material of the invention having a thickness of 10 micrometers was produced.

The material was examined and found to not have tears or holes. Samples were prepared for tensile tests, surface roughness measurements, and surface layer separation tests. Surface roughness measurements and surface layer separation tests were made on the liquid crystal polymer film surface after removal of the support membrane from the liquid crystal polymer film surface. The test results are shown in Table 1.

EXAMPLE 4

A multiaxially-oriented liquid crystal polymer film was made as described in Example 1 above, except that the liquid crystal polymer blown film was laminated between the porous expanded polytetrafluoroethylene membranes at an applied pressure of about 3 kg/cm.

The material was examined and found to not have tears or holes. Samples were prepared for tensile tests, surface roughness measurements, and surface layer separation tests. Surface roughness measurements and surface layer separation tests were made on the liquid crystal polymer film surface after removal of the support membrane from the liquid crystal polymer film surface. The test results are shown in Table 1.

COMPARATIVE EXAMPLE 1

A thermotropic liquid crystal polymer film of VECTRA® A-950 resin was made as described in Example 1, except that no porous support membrane was used, to make a film having a thickness of 50 micrometers. The film was then biaxially stretched as described in Example 1.

The stretched film had numerous tears and holes, and was not suitable for further testing.

COMPARATIVE EXAMPLE 2

A thermotropic liquid crystal polymer (VECTRA® A-950 resin, supplied by Polyplastics Co.) was extruded and blown at a ratio of 1.2:1 to provide a film 50 micrometers thick. A 50 mm diameter uniaxial screw extruder with a rotating die (Type 304 SS) having a 100 mm orifice was used. Extrusion conditions were: die rotation rate—30 RPM; die temperature—300° C.; takeup rate—10 m/min. The film was not stretched.

The film was examined and found to not have tears or holes. Samples were prepared for tensile tests, surface roughness measurements, and surface layer separation tests. The test results are shown in Table 1.

COMPARATIVE EXAMPLE 3

A thermotropic liquid crystal polymer film of VECTRA® A-950 resin was made as described in Comparative Example 2, except that a die having a lip surface of tantalum (5 mm thick) was used. The film was not stretched.

The film was examined and found to not have tears or holes. Samples were prepared for tensile tests, surface roughness measurements, and surface layer separation tests. The test results are shown in Table 1.

COMPARATIVE EXAMPLE 4

A lyotropic liquid crystal polymer film of PPTA was solvent cast and made as described in Example 2, except that no porous support membrane was used. The film had a thickness of 40 micrometers.

The film was stretched in two directions as described in Example 2.

The stretched film had numerous tears and holes, and was not suitable for further testing.

TABLE 1

| | Thickness | | Surface Layer | Surface Roughness, | Tensile Strength $(kg/mm^2)$ | | Elongation percent | |
|---|---|---|---|---|---|---|---|---|
| | µm | Tears | Separation | pm | MD | TD | MD | TD |
| Example 1 | 10 | none | Yes | 0.40 | 21 | 20 | 3 | 3 |
| Example 2 | 10 | none | Yes | 0.37 | 25 | 23 | 11 | 13 |
| Example 3 | 10 | none | No | 0.03 | 27 | 26 | 3 | 3 |
| Example 4 | 10 | none | No | 0.09 | 20 | 22 | 3 | 3 |
| Comp. Ex. 1 | — | many | n/a | — | — | — | — | — |
| Comp. Ex. 2 | 50 | none | Yes | 2.4 | 15 | 13 | 7 | 8 |
| Comp. Ex. 3 | 50 | none | Yes | 2.4 | 16 | 14 | 7 | 8 |
| Comp. Ex. 4 | — | many | not applicable | — | — | — | — | — |

I claim:

1. A multiaxially-oriented composite material comprising:
   (a) at least one stretched porous support membrane of synthetic polymer and
   (b) at least one nonporous stretched oriented film of liquid crystal polymer;
   said porous support membrane and said nonporous liquid crystal polymer film adhered together in laminar relationship to form a composite material having a nonporous liquid crystal polymer layer,
   said composite material being stretched in at least two directions to multiaxially orient the liquid crystal polymer film;
   said composite material having at least one physical property selected from the group consisting of tensile strength, tensile elongation, and thermal expansion wherein said at least one physical property has substantially equal values in the directions of stretch.

2. The composite material as recited in claim 1, wherein the porous support membrane is a porous polytetrafluoroethylene membrane.

3. A multiaxially-oriented composite material comprising:
   (a) a stretched porous support membrane of synthetic polymer, and
   (b) a stretched oriented region of liquid crystal polymer within said porous support membrane;
   said liquid crystal polymer being impregnated into, and filling the pores to a depth of at least 50 percent of the thickness of said porous support membrane, thereby forming a composite material consisting of a nonporous region of liquid crystal polymer within said porous support membrane;
   said composite material being stretched in at least two directions so as to multiaxially orient the liquid crystal polymer;
   said liquid crystal polymer forming a multiaxially oriented region within the porous support membrane;
   said composite material having at least one physical property selected from the group consisting of tensile strength, tensile elongation, and thermal expansion wherein said at least one physical property has substantially equal values in the directions of stretch.

4. The composite material as recited in claim 3, wherein the porous support membrane is porous polytetrafluoroethylene.

5. A non-porous multiaxially-oriented composite material comprising:
   (a) at least one stretched nonporous support membrane of synthetic polymer and
   (b) at least one nonporous stretched oriented film of liquid crystal polymer;
   said nonporous support membrane and said liquid crystal polymer film adhered together in laminar relationship to form a nonporous composite material,
   said composite material being co-stretched in at least two directions to multiaxially orient the liquid crystal polymer film;
   said composite material having at least one physical property selected from the group consisting of tensile strength, tensile elongation, and thermal expansion wherein said at least one physical property has substantially equal values in the directions of stretch.

6. The composite material as recited in claim 5, wherein the nonporous support membrane is polyethersulfone.

7. A process for producing a multiaxially-oriented composite material incorporating a liquid crystal polymer film comprising the steps of:
   (a) adhering a liquid crystal polymer film in laminar relationship to at least one porous or nonporous support membrane of synthetic polymer to form a composite material;
   (b) heating the composite material obtained in step (a) while under tension to a temperature above the melt point of the liquid crystal polymer;
   (c) stretching the heated composite material of step (b) in at least two directions while maintaining the temperature at or above the melt point of the liquid crystal polymer, thereby imparting multiaxial orientation to the liquid crystal polymer film; and
   (d) cooling the product of step (c);
   whereby a composite material having at least one physical property selected from the group consisting of tensile strength, tensile elongation, and thermal expansion wherein said at least one physical property has substantially equal values in the directions of stretch is produced.

8. The process as recited in claim 7, wherein the support membrane is a porous polytetrafluoroethylene membrane.

9. The process as recited in claim 7, wherein the support membrane is a nonporous polyethersulfone membrane.

10. A process for producing a multiaxially-oriented composite material incorporating a liquid crystal polymer region within the interconnected pores of a porous support membrane of synthetic polymer comprising the steps of:

(a) impregnating liquid crystal polymer into a porous support membrane of synthetic polymer, and filling the interconnected pores of the support membrane to a depth of at least 50 percent of the thickness of said support membrane, thereby forming a nonporous region of liquid crystal polymer within said porous support membrane to form a composite material;

(b) stretching the composite material obtained in step (a) in at least two directions to multiaxially orient the liquid crystal polymer while maintaining said liquid crystal polymer in a liquid state; and (c) solidifying said liquid crystal polymer, whereby a composite material having at least one physical property selected from the group consisting of tensile strength, tensile elongation, and thermal expansion wherein said at least one physical property has substantially equal values in the directions of stretch is produced.

11. The process for producing a multiaxially-oriented liquid crystal polymer region within the interconnected pores of a porous support membrane as recited in claim 10, wherein step (b) comprises the steps of:

(i) heating said composite material obtained in step (a) while under tension to a temperature above the melt point of said liquid crystal polymer; and (ii) stretching the heated composite material of step (i) in at least two directions while maintaining the temperature at or above the melt point of said liquid crystal polymer, thereby imparting the desired orientation to said liquid crystal polymer, and wherein step (c) comprises the step of cooling the product of step (ii), whereby a composite material having at least one physical property selected from the group consisting of tensile strength, tensile elongation, and thermal expansion wherein said at least one physical property has substantially equal values in the directions of stretch is produced.

12. The process as recited in claim 11, wherein the porous support membrane is a porous polytetrafluoroethylene membrane.

13. The process as recited in claim 10, wherein the porous support membrane is a porous polytetrafluoroethylene membrane.

* * * * *